US006938198B1

(12) United States Patent
Purcell

(10) Patent No.: US 6,938,198 B1
(45) Date of Patent: Aug. 30, 2005

(54) METHOD AND SYSTEM FOR ACCELERATING ETHERNET CHECKSUMS

(75) Inventor: Stephen C. Purcell, Mountain View, CA (US)

(73) Assignee: Broadband Royalty Corporation, Wilmington, DE (US)

(*) Notice: Subject to any disclaimer, the term of this patent is extended or adjusted under 35 U.S.C. 154(b) by 348 days.

(21) Appl. No.: 09/972,007

(22) Filed: Oct. 5, 2001

Related U.S. Application Data

(60) Provisional application No. 60/283,665, filed on Apr. 12, 2001.

(51) Int. Cl.[7] .............................................. H03M 13/00
(52) U.S. Cl. ..................................... 714/758; 714/779
(58) Field of Search ................................ 714/758, 779

(56) References Cited

U.S. PATENT DOCUMENTS 3,678,469 A * 7/1972 Freeman et al. ............ 714/779
6,804,257 B1 * 10/2004 Benayoun et al. .......... 370/471

OTHER PUBLICATIONS

TDB-ACC-NO: NN72091314,"Parallel CRC Generation for Multilength Characters", Sep. 1972, IBM Technical Disclosure Bulletin, Sep. 1972.*

TDB-ACC-NO: NN930251,"Cyclic Redundancy Code Computation for a Variable Length Data", Feb. 1993, IBM Technical Disclosure Bulletin.*

* cited by examiner

Primary Examiner—Joseph D. Torres
(74) Attorney, Agent, or Firm—Oblon, Spivak, McClelland, Maier & Neustadt, P.C.

(57) ABSTRACT

A method for computing Ethernet checksums for implementing ECC processing within high performance digital transmission networks. The method includes the step of receiving an input data word and receiving an input CRC. The input data word can be 64 bits. The input CRC can be 32 bits. The input data word and the input CRC are combined using an exclusive-or function to obtain a data-CRC combination. The data-CRC combination is then positioned with respect to a time line reference. The data-CRC combination is positioned by extending the data-CRC combination with a number of future bits and shifting the extended data-CRC combination with respect to the time line reference. An output CRC is then computed for the extended data-CRC combination. The output CRC can be computed without regard to a number of valid data bits of the input data word.

8 Claims, 5 Drawing Sheets

*FIG. 5A*

```
Module crc_64(datain, crc_in  sel, crc_out );    // 3 sep 00    Steve Purcell input [63:0] datain;    // valid datain[63:56] if sel=1000000; [63:0], 00000001
input [31:0] crc_in;
input [ 7:0] sel;       // "one-hot", valid datain [63:32] if 0001000;
output [31:0] crc_out;
wire   [31:0] crc_out;

wire [31:0] c = crc_in; // c is just a short name for crc_in wire [ 6:0] s = {sel[7:1] |sel[7:2] |sel[7:3] // clear 1st 3 invalid bytes wire [63:0] d0 = {c[24],c[25],c[26],c[27],c[28],c[29],c[30],c[31],c[16],c[17],
   c[18],c[19],c[20],c[21],c[22],c[23],c[08],c[09],c[10],c[11],c[12],c[13],c[14],
   c[15],c[00],c[01],c[02],c[03],c[04],c[05],c[06],c[07], 32'h0}((datain &
   {8'hFF, {8{s[6]}},{8{s[5]}},{8{s[4]}},{8{s[3]}},{8{s[2]}},{8{s[1]}},{8{s[0]}}})

wire [71:0] d1 = | (sel & 8'b01010101)    ?    (d0 << 8) : d0;
wire [87:0] d2 = | (sel & 8'b00110011)    ?    (d1 << 16): d1;
wire [87:0] d  = | (sel & 8'b00001111)    ?    d2        : d2 >> 32;

assign circ_out [00]  = ^{ d & 88'h2DA70DA4EF806882000000 };
assign circ_out [01]  = ^{ d & 88'hBB740B7698C05CC3000000 };
assign circ_out [02]  = ^{ d & 88'h701D089FA3E0C6E3000000 };
assign circ_out [03]  = ^{ d & 88'hB80E84CF5170E371000000 };
assign circ_out [04]  = ^{ d & 88'h71A0CF43C73899BA000000 };
assign circ_out [05]  = ^{ d & 88'h1577EA058C1C24DF000000 };
assign circ_out [06]  = ^{ d & 88'h8A3BF502460E926F000000 };
assign circ_out [07]  = ^{ d & 88'hE83A77A5CC87A1B5000000 };
assign circ_out [08]  = ^{ d & 88'h593AB6F60943B8D8000080 };
assign circ_out [09]  = ^{ d & 88'h2C1D5BFB84215C6C000040 };
assign circ_out [10]  = ^{ d & 88'hBB29A0D92D9046B4000020 };
assign circ_out [11]  = ^{ d & 88'hF0B3DD48F9C84BD8000010 };
assign circ_out [12]  = ^{ d & 88'hD57E630093644DEE000008 };
assign circ_out [13]  = ^{ d & 88'h6ABF318049B22677000004 };
assign circ_out [14]  = ^{ d & 88'hB5DF16C02459933B000002 };
assign circ_out [15]  = ^{ d & 88'hDA6F0C6092ACC91D000001 };
```

TO FIG.5B

FROM FIG.5A

```
assign circ_out [16] = ^ { d & 88'hC0900B94A6568C8C008000 };
assign circ_out [17] = ^ { d & 88'h60C8054A532B4646004000 };
assign circ_out [18] = ^ { d & 88'h30E402A5A9152323002000 };
assign circ_out [19] = ^ { d & 88'h187281D2D48A9111001000 };
assign circ_out [20] = ^ { d & 88'h0CB940696AC5C808000800 };
assign circ_out [21] = ^ { d & 88'h865CA034B5626404000400 };
assign circ_out [22] = ^ { d & 88'h6E895D3EB5B15A80000200 };
assign circ_out [23] = ^ { d & 88'h9A63233B35D845C2000100 };
assign circ_out [24] = ^ { d & 88'hCDB1919D1AEC2261800000 };
assign circ_out [25] = ^ { d & 88'hE6D8C84E0D769130400000 };
assign circ_out [26] = ^ { d & 88'h5ECB6903E93B209A200000 };
assign circ_out [27] = ^ { d & 88'hAFE5B481F41D104D100000 };
assign circ_out [28] = ^ { d & 88'hD772DA40FA0E8826080000 };
assign circ_out [29] = ^ { d & 88'h6B396D207D074413040000 };
assign circ_out [30] = ^ { d & 88'hB59C3690BE03A209020000 };
assign circ_out [31] = ^ { d & 88'h5A4E1B48DF01D104010000 };

endmodule
```

*FIG. 5B*

METHOD AND SYSTEM FOR ACCELERATING ETHERNET CHECKSUMS

This application claims the benefit of commonly assigned U.S. Provisional Application Ser. No. 60/283,665, "METHOD AND APPARATUS FOR ACCELERATING ETHERNET CHECKSUMS", by Stephen C. Purcell, filed Apr. 12, 2001, which is incorporated herein in its entirely.

FIELD OF THE INVENTION

The field of the present invention pertains to error correction codes for use in digital systems. More particularly, the present invention pertains to implementing efficient error correction processes for an Ethernet based communications network.

BACKGROUND ART

One of the most important societal changes of recent times has been the emergence of the Internet and the World Wide Web (e.g., the Web) as a predominant communications medium. The Internet is a general purpose, public computer network which allows millions of computers all over the world, connected to the Internet, to communicate and exchange digital data with other computers also coupled to the Internet. As new technologies emerge, the speed at which one can connect onto the Internet is ever increasing. New Internet enabled applications include realtime, two-way teleconferencing and videoconferencing, streaming audio and video, peer-to-peer file sharing, etc. With the increasing availability of data transfer bandwidth and the proliferation of broadband connections to the Internet, video-on-demand, HDTV, IP telephony, video teleconferencing, and other types of bandwidth intensive applications will become widespread. Virtually all of these new technologies are digitally based, with their constituent information being delivered over digital communications networks.

Ethernet based networks have become the most prevalent communications standard. Ethernet based networking is the most widely-used local area network (LAN) access method, defined by the IEEE as the 802.3 standard. For example, Ethernet has become so widespread that a specification for "LAN connection" or "network card" generally implies an Ethernet based LAN connection or network card without explicitly saying so. Many desktop PCs come with 10/100 Ethernet ports for either home or business/corporate use. For example, Ethernet based components are used not only to create a small home networks, but to connect to the Internet via a DSL or cable modem, which requires it. A 10/100 port means that it supports both 10BaseT at 10 megabits per second (Mbps) and 100BaseT at 100 Mbps.

Ethernet has evolved over time from twisted pair Ethernet (10/100BaseT), which uses economical telephone wiring and standard RJ-45 connectors, to Fiber-optic Ethernet (10BaseF and 100BaseFX), which uses optical fiber as the transmission media. More modern, high performance networks are expected to use a complete fiber-optic network architecture, spanning from individual buildings (or perhaps homes) to the network backbone.

Ethernet transmits variable length frames from 72 to 1518 bytes in length, each containing a header with the addresses of the source and destination stations and a trailer that contains error correction data. The control and correction of errors in an Ethernet based network is primarily implemented through error control coding schemes. Error control coding, as implemented in an Ethernet frame, incorporates a certain amount of redundant information into the frame that allows the receiver (e.g., a gigabit Ethernet router) to detect and/or correct bit errors occurring in transmission.

Generally, error-control coding techniques are used to detect and/or correct errors that occur in the message transmission in a digital communications system. The transmitting side of the error-control coding adds redundant bits or symbols to the original signal sequence and the receiving side uses these bits or symbols to detect and/or correct any errors that occurred during transmission. Ethernet uses a Cyclic Redundancy Check (CRC) method of error control coding.

Recent advances in fiber optic technology and the use of advanced, high speed fiber optic networks has greatly increased the speed and performance of digital transmission methods. A limiting factor in the efficiency of high performance, fiber optic based Ethernet networks is the successful implementation of high speed ECC digital signal processing. For example, newly emerging 10 Gigabit Ethernet is being adopted to handle the most bandwidth intensive applications. 10 Gigabit Ethernet enables a familiar network technology to be used in LAN, MAN and WAN architectures. For improved efficiency, the well known CSMA/CD method for gaining access to the physical medium is not employed. Only full duplex operation is supported. 10 Gigabit Ethernet uses multimode optical fiber up to 300 meters and singlemode fiber up to 40 kilometers.

A problem exists however, where the high speeds of Gigabit Ethernet networks greatly limit the time available for implementing ECC processing. The Ethernet frames are arriving so fast, the processing time for examining and processing the error control coding portions of the arriving frames is significantly limited. This trend is greatly increasing the cost of the ECC processing hardware that is incorporated into the nodes of the Gigabit Ethernet network (e.g., the switches, routers, add-drop multiplexers, etc.).

Prior art FIG. 1 shows a basic diagram of the operation of a typical prior art CRC checksum processing system 100. As depicted in FIG. 1, system 100 includes a data register 101 and a CRC register 102. The data register 101 and CRC register 102 are both coupled to an exclusive-or logic function 103.

System 100 shows the basic characteristic of CRC checksums, being the fact that each bit of the CRC checksum is a function of each of the data bits of data register 101 and the CRC "history" bits of the CRC register 102. The exclusive-or logic function 103 is used to generate the CRC checksum, referred to simply as the CRC, within the CRC register 102. The exclusive-or logic function is typically implemented using a "tree" of multiple exclusive-or gates. As shown by line 110, individual bits of the data register 101 are shifted out to external circuits (e.g., output data). Each of these bits are combined with CRC bits from CRC register 102 via line 111. Line 115 shows a feed back function of the CRC register 102, whereby each bit of the output of the exclusive-or logic function 103 is "exclusive-or'ed" back into the CRC register 102.

Prior art FIG. 2 shows a basic diagram 200 depicting the relationship between the CRC history bits, the data, and the newly computed CRC. As described above, each bit of data 201 and previous CRC 202 are combined using an exclusive-or function, shown here as a plurality of exclusive-or gates 203a–203d, to obtain the new CRC 205. Thus, even though the data register may be much larger than the CRC register, each bit of data influences the final state of the CRC register. Once the contents of the data register 201 is shifted out to the external circuits (e.g., as output data), the contents of the new CRC register 205 is also shifted out and appended to the end of the data.

The problem for such prior art systems is the high speed processing of the CRC checksums. As described above, a problem exists where the high speeds of Multi-Gigabit Ethernet networks greatly limit the time available for implementing ECC processing. Ethernet frames can be many bytes long. Accordingly, prior art high speed CRC processing systems are designed to process multiple bytes of data at a time. Logic functions, such as the exclusive-or function 103, need to be executed for each bit of the multiple bytes of data that are processed per cycle.

The number of logic operations possible per clock cycle is limited. To perform the large number of logic operations required for multiple byte CRC processing units, prior art implementations use large "trees" of logic gates. For example, in multi-gigabit implementations, the number of successive logic operations possible per clock cycle is typically 8 logic operations or less. The time it takes for a signal to cascade through an exclusive-or gate allows only 8 or less of such gates to be linked (e.g., in a tree). Thus, typical prior art implementations seek to perform as many logic operations in parallel as possible. This leads to very large, wasteful circuit designs having a large number of logic gates dedicated to performing CRC logic functions.

An added complication is the fact that the output CRC needs to accurately reflect the number of valid data bytes in the input data word being processed. For example, in the case of a 64 bit input data word where only data in the first 56 bits is valid, the output CRC needs to reflect only the 56 valid bits. Thus, the CRC processing circuit needs to recognize and properly compute the output CRC for the 56 bit sub-portion of the input data word. These complications are very difficult to handle using the prior art "massively parallel" approach. Typical prior art solutions to this problem involve implementing different processing circuits to handle different cases of valid input data (e.g., 56 bits, 48 bits, 40 bits, etc.).

Additional descriptions of error control coding and CRC processing in particular can be found in "Error Control Coding: Fundamentals and Applications" by Shu Lin and Daniel J. Costello, Jr., ISBN 0-13-283796-X, which is incorporated herein.

Thus what is required is a specific solution for implementing ECC processing within high performance digital transmission networks. What is required is a solution that implements an efficient algorithm for computing the CRC checksums that are used with Ethernet frames. The present invention provides a novel solution to the above requirements.

SUMMARY OF THE INVENTION

The present invention provides a solution for implementing ECC processing within high performance digital transmission networks. The present invention implements an efficient algorithm for computing the CRC checksums that are used with Ethernet frames.

In one embodiment, the present invention is implemented as an algorithm for computing Ethernet checksums for implementing ECC processing within high performance digital transmission networks. The algorithm includes the step of receiving an input data word and receiving an input CRC. The input data word typically can be 64 bits. The input CRC typically can be 32 bits. The input data word and the input CRC are combined using an exclusive-or function to obtain a data-CRC combination. The data-CRC combination is then positioned with respect to a time line reference. The data-CRC combination is positioned by extending the data-CRC combination with a number of future bits and shifting the extended data-CRC combination with respect to the time line reference. An output CRC is then computed for the extended data-CRC combination. The output CRC can be computed without regard to a number of valid data bits of the input data word.

In so doing, a common CRC processing circuit can be implemented that processes input data words having different combinations of valid data bytes. Instead of implementing a number of respective circuits for handling the different cases of valid input data bytes (e.g., 56 bits, 48 bits, 40 bits, etc.), the common CRC processing circuit can handle the different cases. Thus a common CRC circuit can be implemented having sufficient parallelism to process multiple byte input data words at high speed without causing wasteful redundancy of large numbers of logic gates.

BRIEF DESCRIPTION OF THE DRAWINGS

The present invention is illustrated by way of example and not by way of limitation, in the figures of the accompanying drawings and in which like reference numerals refer to similar elements and in which:

Prior art

Prior art

FIG. 5 shows an HDL (hardware description language) representation of an ECC processing system in accordance with one embodiment of the present invention is shown.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Embodiments of the present invention are directed to a method and system for implementing ECC processing within high performance digital transmission networks. The present invention implements an efficient algorithm for computing the CRC checksums that are used with Ethernet frames. The present invention and its benefits are further described below.

Figure 1:
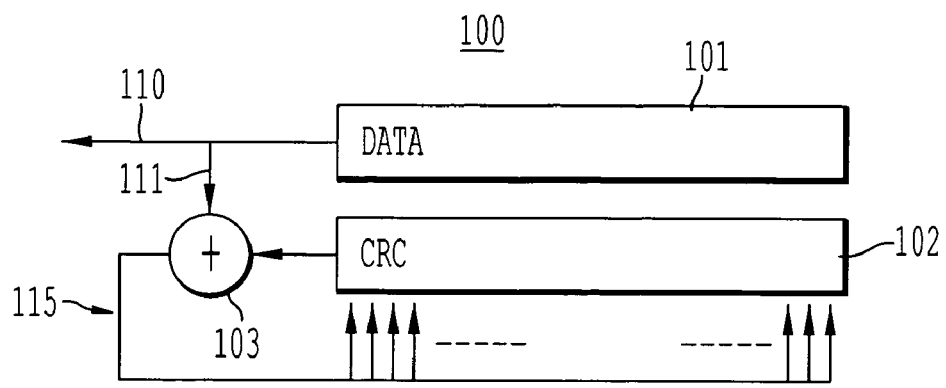
FIG. 1 shows a basic diagram of the operation of a typical prior art CRC checksum processing system.
Figure 2:
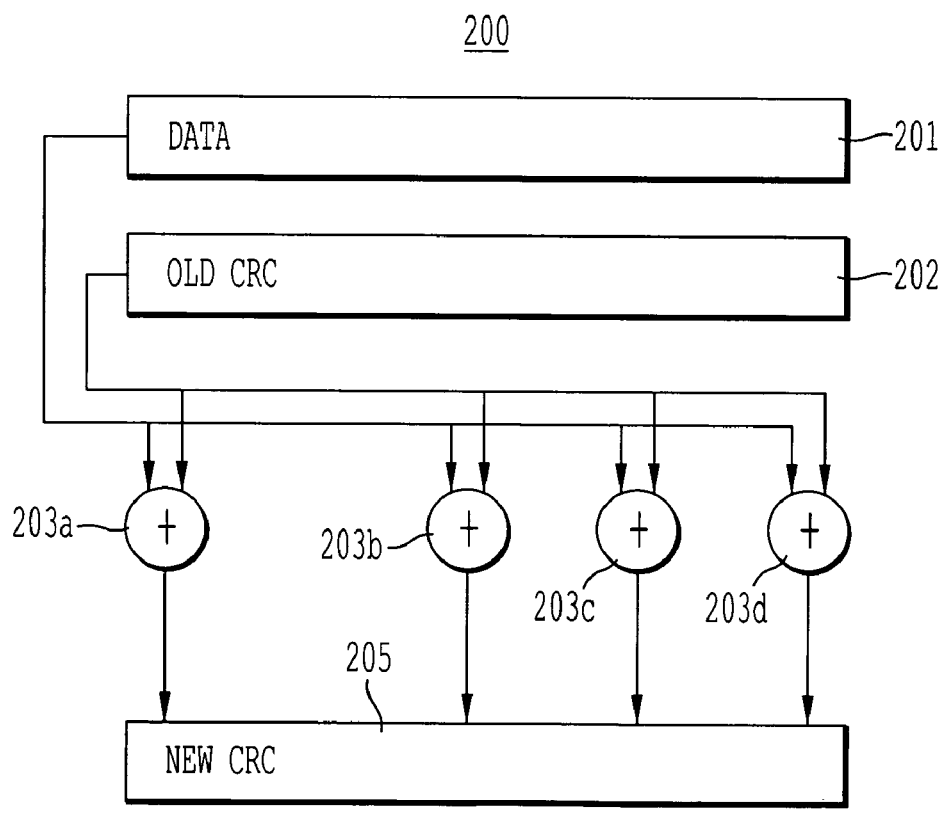
FIG. 2 shows a basic diagram depicting the relationship between the CRC history bits, the data, and the newly computed CRC.
Figure 3:
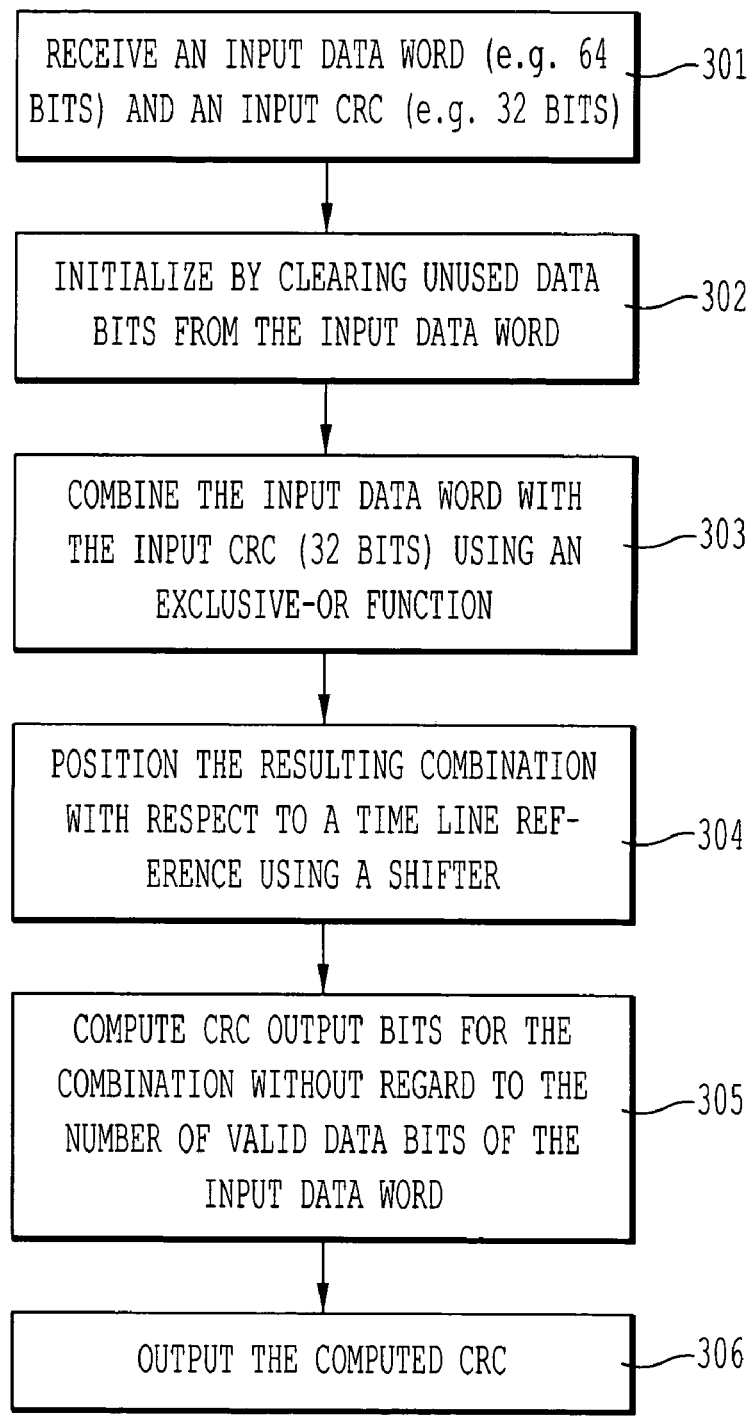
FIG. 3 shows a flow chart of the steps of a CRC checksum processing method for implementing ECC processing within a high speed digital transmission network.

FIG. 3 shows a flow chart of the steps of a CRC checksum processing method 300 for implementing ECC processing within a high speed digital transmission network.

In this embodiment, the method 300 comprises an algorithm implemented by a high speed ECC processing system for receiving an input data word and an input CRC checksum and generating an output CRC checksum therefrom. The system can be implemented, for example, on an integrated circuit within a high performance digital communications switch or router.

Method 300 begins in step 301 where an input data word and an input CRC is received by an ECC processing system in accordance with one embodiment. In a typical implementation, the input data word is 64 bits, or 8 bytes, and the CRC is 32 bits. The input data word and the CRC are received by the ECC processing system, for example, from a high performance multi-gigabit Ethernet communications network. In an Ethernet implementation, the variable length Ethernet frames (e.g., varying from 72 to 1518 bytes in length) are segmented into a series of constituent 64 bit input data words and a 32 bit CRC checksum for the entire Ethernet frame.

In step 302, the ECC processing system initializes itself for accepting the incoming input data word and CRC. In one embodiment, the input data word and CRC are received at respective registers. The register for the input data word is initialized by clearing unused data bits from the register (e.g., clearing the unused bit positions with zeros).

In step 303, the input data word and the CRC are combined using a logical exclusive-or operation. This step takes advantage of the fact that each bit of the CRC output is affected by "earlier" bits of CRC input and data input (which can be immediately combined). Thus, in a 64 bit data word and 32 bit CRC embodiment, up to 64 "earlier" bits of CRC input and data input can be immediately combined through the logical exclusive-or operation.

In step 304, the resulting data-CRC combination is positioned with respect to a time line reference of the ECC processing system. In a 64 bit data word and 32 bit CRC embodiment, this step shifts the data-CRC combination with respect to the 64 earlier bits of data input described in step 303. The 64 earlier bits that influence the CRC output are computed by shifting the data-CRC combination by up to 24 bits left or 32 bits right. The resulting 88 bit span can encompass each of the eight cases of input that depend on the number of valid bits in the input data word (e.g., see FIG. 4 below). Thus, the ECC processing system can be implemented to function with this 88 bit span, and thereby provide a single circuit that can function with any of the eight cases.

In step 305, the CRC output bits are computed for the data-CRC combination. The ECC processing system is configured to function with the data-CRC combination that has been positioned with respect to the time line reference as described in step 304. Each output bit of the output CRC traverses a signal path of no more than 7 logic gates (e.g., exclusive-or gates), and thus, the output CRC is computed within the time limits of the required high speed operation of the switch/router. In other words, each output bit of the output CRC is the exclusive-or of certain earlier positions of the data-CRC combination and can be implemented using a fixed tree of exclusive-or gates of a depth no greater than 7.

Subsequently, in step 306, the computed output CRC is shifted out, appended to the data word, and transmitted along, for example, to the next components within the switch/router or out onto the network.

Thus, method 300 allows the output CRC to be computed without regard to a number of valid data bits of the input data word. In so doing, a common CRC processing circuit can be implemented that processes input data words having different combinations of valid data bytes. Instead of implementing a number of respective circuits for handling the different cases of valid input data bytes (e.g., 56 bits, 48 bits, 40 bits, etc.), the common CRC processing circuit can handle the different cases. Thus a common CRC circuit can be implemented having sufficient parallelism to process multiple byte input data words at high speed without causing wasteful redundancy of large numbers of logic gates.

Figure 4:
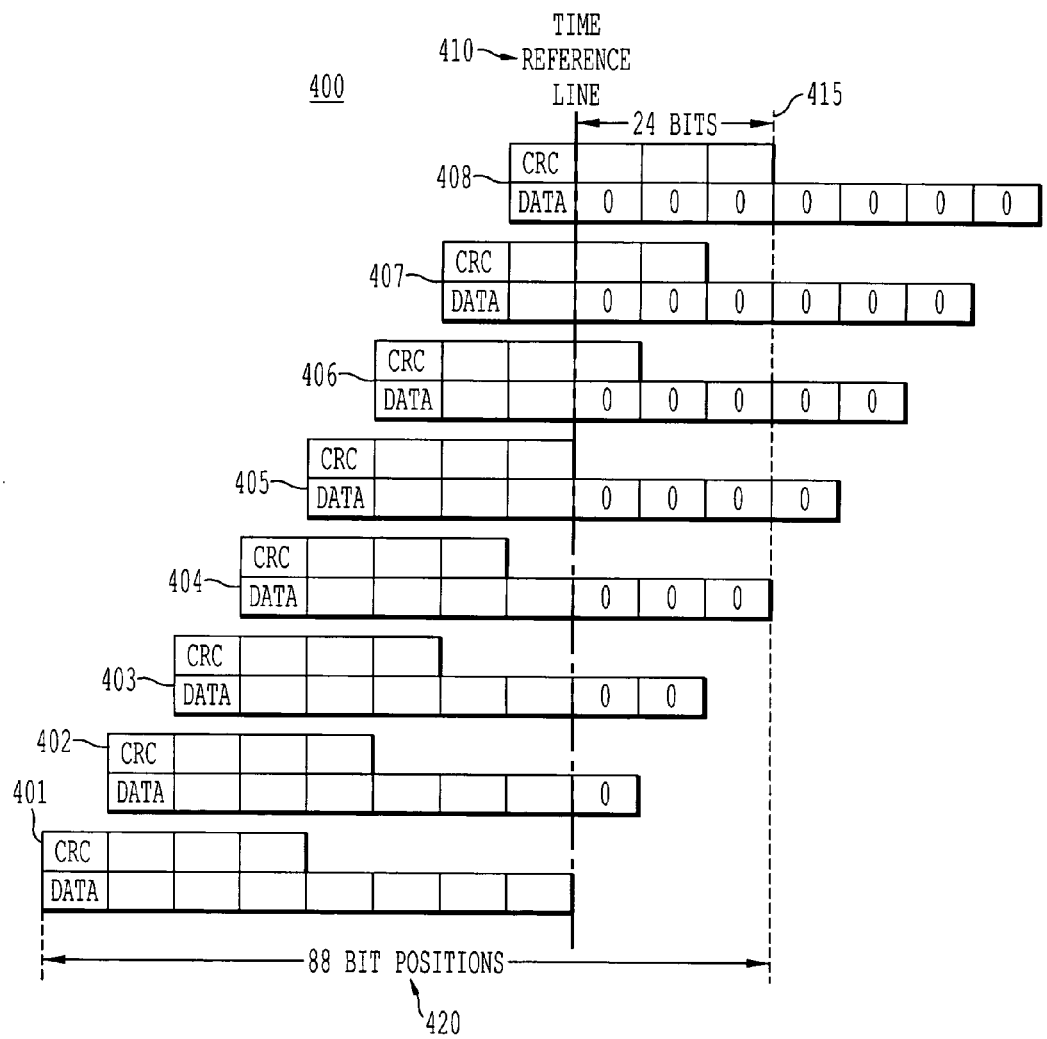
FIG. 4 shows a diagram depicting the operation of the time line reference of the ECC processing circuit with respect to the data-CRC combination in accordance with one embodiment of the present invention.

FIG. 4 shows a diagram 400 depicting the operation of the time line reference of the ECC processing circuit with respect to the data-CRC combination in accordance with one embodiment of the present invention. FIG. 4 shows the 8 different cases 401–408 of possible valid data within the input data word. Each of the cases 401–408 shows a 4 byte input CRC and an 8 byte input data word combination.

As shown in FIG. 4, the case 401 shows a data word having valid data in all 8 bytes (invalid bytes are shown as zeroes). Case 402 shows a data word having valid data in the first 7 bytes, and so on, to case 408 where valid data is in only the first byte. As described above in step 304, the data-CRC combinations (cases 401–408) are positioned with respect to a time line reference 410 of the CRC processing system. Thus, in this 64 bit data word and 32 bit CRC embodiment, the 64 earlier bits that influence the CRC output are computed by shifting the data-CRC combination by 24 bits. This is shown by line 415. The resulting 88 bit span 420 encompasses each of the eight possible cases 401–408. Thus, the ECC processing system can be implemented with a logic function tree configured to evaluate this 88 bit span, and thereby provide a single circuit that can function with any of the eight cases 401. Each of the cases 401–408 use at most 64 bit positions of the 88 bit span.

Referring now to FIG. 5, an HDL (hardware description language) representation of an ECC processing system in accordance with one embodiment of the present invention is shown. As depicted in FIG. 5, an HDL representation of a 64 bit ECC processing system (Module crc_64) is shown.

In this embodiment, the input data word is 64 bits (datain) and the input CRC is 32 bits (crc_in). A mode select variable (sel) is used to indicate the number of valid data bits within the 64 bit input data word. In other words, the mode select variable is used to indicate which case of input data word is being operated upon (e.g., which of cases 401–408). For example, datain[63:56] is valid and sel=1000000, datain[63:48] is valid and sel=01000000, and the like, or datain[63:0] is valid and sel=00000001. The output of the ECC processing system is a 32-bit output CRC (crc_out).

It should be noted that in order to facilitate high speed operation, the ECC processing system in accordance with a preferred embodiment will combine between 1 and 8 bytes per cycle using a CRC accumulator register.

Thus, the present invention provides a solution for implementing ECC processing within high performance digital transmission networks. The present invention implements an efficient algorithm for computing the CRC checksums that are used with Ethernet frames. In so doing, a common CRC processing circuit can be implemented that processes input data words having different combinations of valid data bytes. Instead of implementing a number of respective circuits for handling the different cases of valid input data bytes (e.g., 56 bits, 48 bits, 40 bits, etc.), the common CRC processing circuit can handle the different cases. Thus a common CRC circuit can be implemented having sufficient parallelism to process multiple byte input data words at high speed without causing wasteful redundancy of large numbers of logic gates.

Additional descriptions of implementations of an ECC processing system in accordance with the present invention can be found in U.S. patent application "A METHOD AND SYSTEM FOR HIGH SPEED ERROR CONTROL PROCESSING IN A DIGITAL COMMUNICATIONS NETWORK", filed on Jul. 6, 2001, Ser. No. 09/900,609, assigned to the assignee of the present invention which is incorporated herein in its entirety.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A method for computing CRC (cyclic redundancy check) checksums, the method comprising the steps of:
   a) receiving an input data word;
   b) receiving an input CRC;
   c) combining the input data word and the input CRC using an exclusive or function to obtain a data-CRC combination;
   d) positioning the data-CRC combination with respect to a time line reference within an extended bit span by shifting the data-CRC combination to create an extended data-CRC combination; and
   e) computing an output CRC from the extended data-CRC combination.

2. The method of claim 1 wherein step d) comprises:
   extending the data-CRC combination with 24 future bits.

3. The method of claim 1 further including the step of:
   using a mode select input to indicate a number of valid data bits of the input data word for computing the output CRC.

4. The method of claim 1 further including the step of:
   combining between 1 and 8 bytes of the input data word per clock cycle by using a CRC accumulator.

5. A system for computing CRC (cyclic redundancy check) Ethernet checksums, comprising:
   a data register for receiving a 64 bit input data word;
   a CRC accumulator for receiving a 32 bit input CRC; and
   logic for combining the input data word and the input CRC using an exclusive-or function to obtain a data-CRC combination,
   the logic further configured to position the data-CRC combination with respect to a time line reference within an extended bit span by shifting the data-CRC combination to create an extended data-CRC combination and to compute a 32 bit output CRC from the extended data-CRC combination.

6. The system of claim 5 wherein the logic is configured to extend the data-CRC combination with 24 future bits.

7. The system of claim 5 wherein the logic is further configured to use a mode select input to indicate a number of valid data bits of the input data word for computing the output CRC.

8. The system of claim 5 wherein the logic is further configured to combine between 1 and 8 bytes of the input data word per clock cycle by using the CRC accumulator.

* * * * *